United States Patent
Brunner et al.

(10) Patent No.: US 9,165,895 B2
(45) Date of Patent: Oct. 20, 2015

(54) METHOD FOR SEPARATING A PLURALITY OF DIES AND A PROCESSING DEVICE FOR SEPARATING A PLURALITY OF DIES

(75) Inventors: Helmut Brunner, Feistritz/Drau (AT); Manfred Engelhardt, Villach Landskron (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 492 days.

(21) Appl. No.: 13/290,201

(22) Filed: Nov. 7, 2011

(65) Prior Publication Data
US 2013/0115736 A1    May 9, 2013

(51) Int. Cl.
*H01L 21/00* (2006.01)
*H01L 23/00* (2006.01)
*H01L 21/683* (2006.01)
*H01L 21/78* (2006.01)

(52) U.S. Cl.
CPC ............ *H01L 24/03* (2013.01); *H01L 21/6835* (2013.01); *H01L 21/78* (2013.01); *H01L 24/05* (2013.01); *H01L 2221/68354* (2013.01); *H01L 2224/03002* (2013.01); *H01L 2224/03464* (2013.01); *H01L 2224/04026* (2013.01); *H01L 2224/05023* (2013.01); *H01L 2224/05147* (2013.01); *H01L 2224/05568* (2013.01); *H01L 2224/05573* (2013.01); *H01L 2224/05644* (2013.01); *H01L 2224/05647* (2013.01); *H01L 2224/32225* (2013.01); *H01L 2924/00014* (2013.01); *H01L 2924/01322* (2013.01); *H01L 2924/1301* (2013.01); *H01L 2924/1305* (2013.01); *H01L 2924/1306* (2013.01); *Y10T 29/49002* (2015.01)

(58) Field of Classification Search
CPC ............... H01L 21/78; H01L 2221/68322; H01L 2221/68327; H01L 2221/68354; H01L 2221/68372; H01L 2224/97; H01L 21/782; H01L 21/58; H01L 21/6835; H01L 21/56
USPC ......... 438/113, 114, 455, 458, 460, 462, 464, 438/465, 127, 68; 257/E21.599
See application file for complete search history.

(56) References Cited

U.S. PATENT DOCUMENTS

| | | | |
|---|---|---|---|
| 5,998,238 A * | 12/1999 | Kosaki | 438/114 |
| 2004/0142284 A1 | 7/2004 | Sakaguchi et al. | |
| 2005/0101116 A1 * | 5/2005 | Tseng | 438/622 |
| 2005/0230263 A1 * | 10/2005 | Dubin | 205/176 |
| 2007/0082486 A1 * | 4/2007 | Yang et al. | 438/666 |
| 2008/0179611 A1 * | 7/2008 | Chitnis et al. | 257/98 |
| 2009/0227070 A1 * | 9/2009 | Miyajima | 438/113 |

FOREIGN PATENT DOCUMENTS

| | | |
|---|---|---|
| CN | 1518072 A | 8/2004 |
| CN | 1720354 A | 1/2006 |
| WO | 2004053202 A1 | 6/2004 |

* cited by examiner

*Primary Examiner* — Khiem D Nguyen

(57) ABSTRACT

A method for separating a plurality of dies is provided. The method may include: selectively removing one or more portions from a carrier including a plurality of dies, for separating the plurality of dies along the selectively removed one or more portions, wherein the one or more portions are located between the dies; and subsequently forming over a back side of the dies, at least one metallization layer for packaging the dies

19 Claims, 5 Drawing Sheets

FIG 1

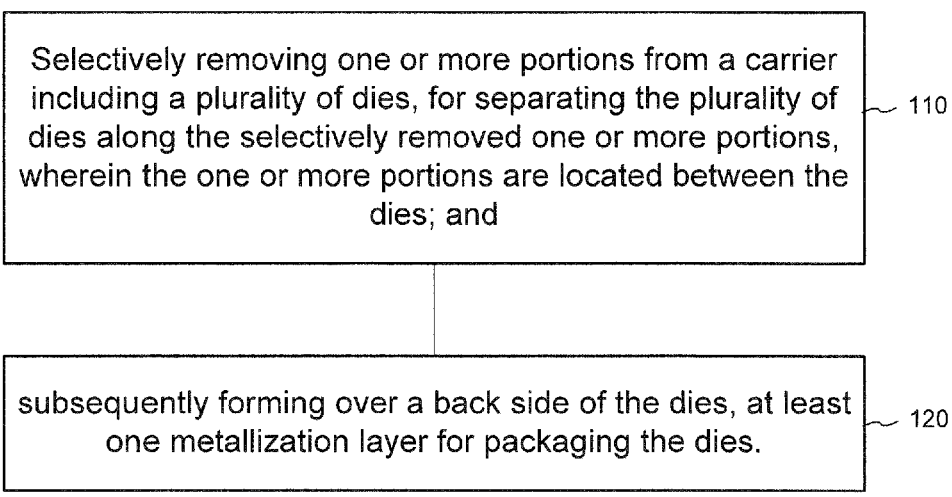

```
┌─────────────────────────────────────────────────────────┐
│ Selectively removing one or more portions from a carrier│
│ including a plurality of dies, for separating the       │── 110
│ plurality of dies along the selectively removed one or  │
│ more portions, wherein the one or more portions are     │
│ located between the dies; and                           │
└─────────────────────────────────────────────────────────┘
                            │
┌─────────────────────────────────────────────────────────┐
│ subsequently forming over a back side of the dies, at   │── 120
│ least one metallization layer for packaging the dies.   │
└─────────────────────────────────────────────────────────┘
```

METHOD FOR SEPARATING A PLURALITY OF DIES AND A PROCESSING DEVICE FOR SEPARATING A PLURALITY OF DIES

TECHNICAL FIELD

Various embodiments relate generally to a method for separating a plurality of dies and a processing device for separating a plurality of dies.

BACKGROUND

Dies, e.g. semiconductor dies, e.g. semiconductor chips, are conventionally separated from a wafer by dicing the wafer. The dies are conventionally separated from each other by sawing the wafer. Sawing may result in the following effects, such as chipping and crack formation, which in turn may impact the reliability of the chip or even the electrical functionality.

SUMMARY

Various embodiments provide a method for separating a plurality of dies. The method may include: selectively removing one or more portions from a carrier including a plurality of dies, for separating the plurality of dies along the selectively removed one or more portions, wherein the one or more portions are located between the dies; and subsequently forming over a back side of the dies, at least one metallization layer for packaging the dies.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for separating a plurality of dies according to an embodiment;

DETAILED DESCRIPTION

Figure 2A:
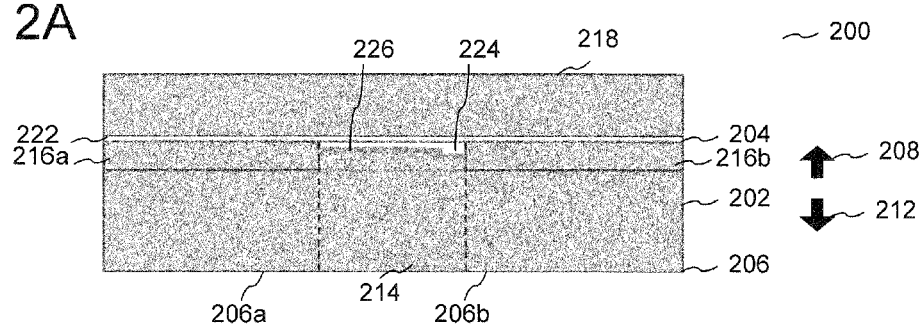
FIGS. 2A to 2I show a method for separating a plurality of dies according to an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments relate to a method for wafer dicing, i.e. separating a plurality of dies, and for depositing a backside metallization while preventing the deposition of backside metal into dicing grooves.

Conventionally, dies, e.g. semiconductor dies, e.g. semiconductor chips, in a wafer are individualized, i.e. separated, by sawing through a carrier to separate one die from another die. A carrier, e.g. a semiconductor wafer, may include one or more dies, e.g. one, two, three, four, five, six, seven, eight, nine, ten or even more dies such as tens or hundreds of dies. One or more semiconductor devices e.g. a diode, e.g. a transistor, e.g. a bipolar junction transistor, e.g. a field effect transistor, e.g. a resistor, e.g. a capacitor, e.g. an inductor, e.g. a thyristor may be formed in the carrier. A die may include one or more semiconductor devices.

One or more semiconductor devices may be processed according to a front-end-of line FEOL process, wherein a front-end-of-line FEOL process includes at least one process used to form the active electrical components of the semiconductor device, e.g. to form the source/drain regions, channel regions, p-doped regions, n-doped regions.

A back-end-of line BEOL process may be carried out wherein metallization layers for electrically connecting the one or more semiconductors may be formed within the carrier.

After FEOL and BEOL processes, the plurality of dies are still part of a single carrier, i.e. the wafer. In other words, the plurality of dies form part of the carrier and the plurality of dies have not yet been individualized, i.e. separated, into individual dies. A backside metallization layer may be deposited on the dies, while the dies are still part of a single carrier. The backside metallization layer may be a metallic layer, e.g. gold, deposited over a back side of the carrier, and therefore, over the back side of the dies, which are still part of a single carrier. The backside metallization may include a eutectic adhesive which may be used for attaching a die to a chip package between at least one die from the plurality of dies and a chip package.

After deposition of the backside metallization layer over the back side of the carrier, and therefore, over the back side of the dies, the plurality of dies which are part of a single carrier may be separated, by sawing through regions, e.g. kerf regions, of the carrier, to separate the plurality of dies into individual dies. An individual die may then be attached to a chip package.

FIG. 1A shows a method 100 for separating a plurality of dies according to an embodiment.

The method includes: selectively removing one or more portions from a carrier including a plurality of dies, for separating the plurality of dies along the selectively removed one or more portions, wherein the one or more portions are located between the dies (in 110); and subsequently forming over a back side of the dies, at least one metallization layer for packaging the dies (in 120).

FIGS. 2A to 2I show a method according to method 100 for separating a plurality of dies according to an embodiment.

FIG. 2A shows a carrier 202 including a plurality of dies 216a, 216b. Carrier 202 may include a semiconductor wafer, e.g. a semiconductor substrate, e.g. a semiconductor substrate. Carrier 202 may include at least one from the following group of materials, the group consisting of: silicon, silicon carbide, gallium arsenide. Carrier 202 may include a plurality of dies 216a, 216b, wherein the plurality of dies 216a, 216b may be formed within carrier 202. Carrier 202 may include a carrier front side 204 and a carrier back side 206, wherein carrier front side 204 may be configured to face a direction 208 opposite to a direction 212 which carrier back side 206 faces. Carrier back side 206 may include one or more die back sides 206a, 206b i.e. a back side of a plurality of dies 206a, 206b.

Plurality of dies 216a, 216b, may include semiconductor dies, e.g. semiconductor chips. Carrier 202, e.g. a semiconductor wafer, may include one or more dies. Carrier 202 may include a plurality of dies, e.g. one, two, three, four, five, six, seven, eight, nine, ten or even more dies such as tens or hundreds of dies.

Plurality of dies 216a, 216b, may each include one or more semiconductor devices, e.g. a diode, e.g. a transistor, e.g. a bipolar junction transistor, e.g. a field effect transistor, e.g. a resistor, e.g. a capacitor, e.g. an inductor, e.g. a thyristor. The one or more semiconductor devices may have been processed according to a front-end-of line FEOL process, wherein a front-end-of-line FEOL process includes at least one process used to form the active electrical components of the semiconductor device, e.g. to form the source/drain regions, channel regions, p-doped regions, n-doped regions.

A back-end-of line BEOL process may have been carried out wherein metallization layers for electrically connecting the one or more semiconductors may have been formed within the carrier. Plurality of dies 216a, 216b may be part of a single carrier 202, i.e. the wafer. The FEOL and BEOL processes are carried out while plurality of dies 216a, 216b may be part of single carrier 202. Plurality dies 216a, 216b may be joined by carrier 202.

One or more portions 214 may be selectively removed from carrier 202 including a plurality of dies 216a, 216b, for separating the plurality of dies 216a 216b along the selectively removed one or more portions 214, wherein the one or more portions 214 are located between the dies 216a, 216b.

In FIG. 2A, carrier 202, including plurality of dies 216a, 216b may be held, e.g. supported, by supporting material 218, wherein carrier 202 may be held by supporting material 218 from carrier front side 204. Carrier 202, including plurality of dies 216a, 216b may be attached, e.g. non-permanently attached, to supporting material 218 from carrier front side 204 via adhesive 222, e.g. a glue, which may be formed between carrier front side 204 and supporting material 218. Supporting material 218 may include another wafer substrate such as silicon, silicon carbide or quartz or ceramics. An alignment mark 224 may be formed on carrier front side 204 which may be used for selectively removing one or more portions 214 in subsequent process steps. Stopping layer 226 may be formed on carrier front side 204 over one or more portions 214 which are to be selectively removed and may be used for selectively removing one or more portions 214 in subsequent process steps.

Figure 2B:
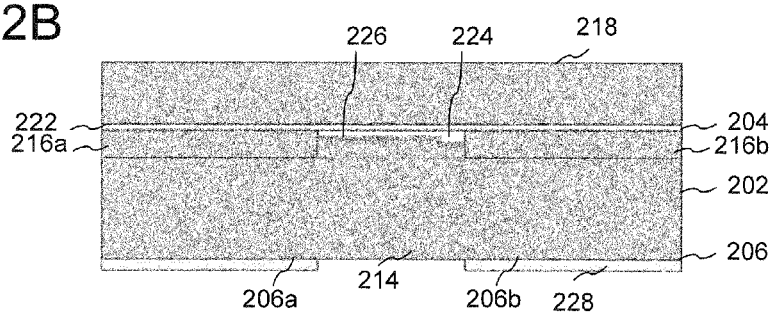

In FIG. 2B, masking layer 228, e.g. a photoresist layer, may be patterned, e.g. using photolithography for etching, e.g. plasma etching, along the dicing lines. Masking layer 228 may be formed over carrier back side 206, wherein masking layer 228 allows one or more portions 214, i.e. one or more kerf regions of carrier 202, to be selectively removed and shields the dies 216a, 216b from being removed. Masking layer 228 may allow one or more portions 214, i.e. one or more kerf regions of carrier 202, to be selectively removed by plasma etching, from carrier back side 206 and may shield dies 216a, 216b from the plasma etch. Masking layer 228, may be patterned using alignment mark 224 formed over carrier front side 204. Alignment mark 224 may be formed over one or more portions 214 which are to be selectively removed, therefore allowing masking layer 228 to be patterned, and therefore defining the regions, i.e. portions 214, which are to be selectively removed.

Stopping layer 226 may be formed over carrier front side 204, e.g. before attaching carrier 202 to supporting material 218. Alignment mark 224 may be formed over carrier front side 204, e.g. before attaching carrier 202 to supporting material 218.

Figure 2C:
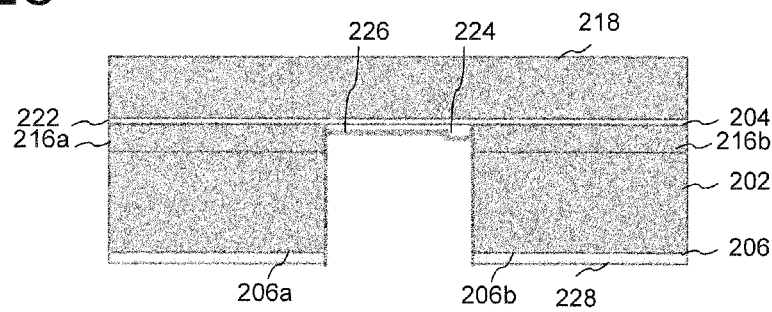

In FIG. 2C, one or more portions 214 may be selectively removed from carrier 202 wherein the one or more portions 214 are located between the dies 216a, 216b. One or more portions 214 may be selectively removed from carrier back side 206. One or more portions 214 may be selectively removed from carrier back side 206 until stopping layer 226 formed on a carrier front side 204 may be exposed from carrier back side 206.

One or more portions 214 may be selectively removed by chemical etching, e.g. by chemically etching one or more portions 214 from carrier back side 206 until stopping layer 226 formed on a carrier front side 204 may be exposed from carrier back side 206. For example, a plasma etch may be carried out taking into account an etch chemistry of process gases.

One or more portions 214 may be selectively removed by plasma etching, e.g. by plasma etching one or more portions 214 from carrier back side 206 until stopping layer 226 formed on a carrier front side 204 may be exposed from carrier back side 206. Methods of plasma etching include reactive ion etching, deep reactive ion etching. The process parameters of the plasma etch process used for plasma dicing are both depending on the material to be removed and on the plasma etch equipment used.

Selectively removing one or more portions 214, separates dies 216a, 216b along the removed one or more portion 214. Even after one or more portions 214 are selectively removed, the separated plurality of dies 216a, 216b may be held by supporting material 218.

Masking layer 228 may be removed, e.g. by dissolving the photoresist layer.

Figure 2D:
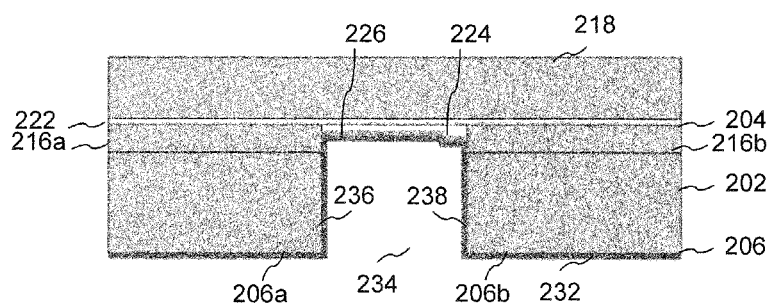

In FIG. 2D, one or more layers 232, e.g. a bather layer 232a, e.g. a seed layer 232b, may be formed over back side 206a, 206b of plurality of dies 216a, 216b for subsequently forming at least one metallization layer. One or more layers 232, e.g. bather layer, e.g. a seed layer, may be formed over back side of plurality of dies 206a, 206b.

One or more layers 232 may include a bather layer 232a. Barrier layer 232a may prevent diffusion of metal into carrier 202. Barrier layer 232a may be deposited over carrier back side 206, and therefore over the back side of plurality of dies 206a, 206b after the selective removal of one or portions 214, e.g. after etching, e.g. plasma etching the dicing lines at the wafer back side. If a seed layer is required for the subsequent formation of a backside metallization layer using electrochemical deposition, seed layer 232b may be deposited over carrier back side 206, and therefore over the back side of plurality of dies 206a, 206b, e.g. over bather layer 232a, e.g. directly on bather layer 232a. Barrier layer 232a may have a thickness ranging from about 0.01 µm to about 1 µm, e.g. about 0.05 µm to about 0.8 µm, e.g. about 0.2 µm to about 0.6 µm. Bather layer 232a may include at least one from the following group of materials, the group consisting of, tantalum, titanium, tantalum nitride, titanium nitride, tungsten, titanium-tungsten. Seed layer 232b may have a thickness ranging from about 0.01 µm to about 1 µm, e.g about 0.05 µm to about 0.8 µm, e.g. about 0.2 µm to about 0.6 µm. Seed layer 232b may include copper.

Forming one or more layers 232, e.g. bather layer 232a, e.g. a seed layer, over carrier back side 206 may include forming one or more layers 232 in the one or more spaces 234 separating plurality of dies 216a, 216b. One or more spaces 234 may be created by the regions between plurality of dies 216a, 216b after one or more portions 214 have been selectively removed. One or more spaces 234 between plurality of dies 216a, 216b, may include one or more trenches extending from carrier back side 206 to stopping layer 226. Depth of one or more trenches, i.e. one or more spaces 234 may be defined by the height of one or more sidewalls 236, 238 of plurality of dies 216a, 216b, extending between carrier back side 206 to stopping layer 226. Stopping layer 226 may form part of a base of one or more trenches.

Forming one or more layers 232, e.g. bather layer 232a, e.g. a seed layer, over carrier back side 206 may include forming one or more layers 232 over one or more sidewalls 236, 238 of plurality of dies 216a, 216b.

Forming one or more layers 232, e.g. bather layer 232a, e.g. a seed layer, over carrier back side 206 may include forming one or more layers over stopping layer 226 from carrier back side 206. Stopping layer 226 may have been exposed from carrier back side 206, due to the selective removal of one or more portions 214.

Figure 2E:
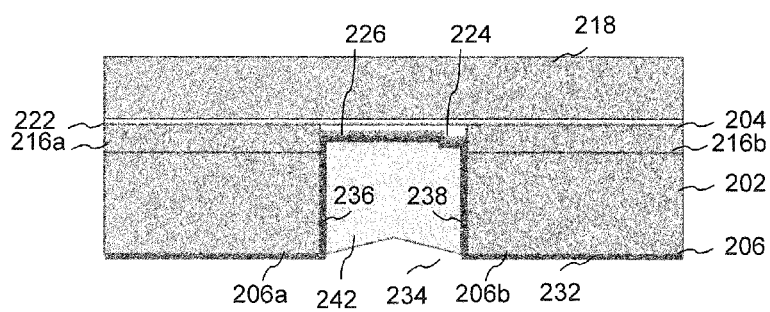

In FIG. 2E, fill material 242 may be deposited into one or more spaces 234, i.e. one or more trenches, separating the plurality of dies 216a, 216b. Stopping layer 226 may define a bottom of one or more trenches, the depth of one or more trenches being defined by the height of one or more sidewalls 236, 238 of plurality of dies 216a, 216b.

One or more spaces 234, i.e. one or more trenches, may be filled with fill material 242, wherein fill material 242 may include an organic material, e.g. a photoresist, e.g. polyimide, e.g. organic resist, e.g. polybenzoxazole, e.g. SiLK. Fill material 242 may be a material which may be easily removed later in the process flow, e.g. a material with sufficient high selectivity to the materials on carrier 202, e.g backside metallization layer subsequently formed on carrier 202. After filling the one or more spaces 234, which may also be known as the dicing grooves, with fill material 242, an etch back may be applied to fill material 242, i.e. fill material 242 may be etched back into the one or more trenches from carrier back side 206. In other words, fill material 242 which was deposited on carrier back side 206 and in one or more spaces 234, i.e. the one or more etched trenches, may be etched back, leaving fill material 234 exclusively in the etched trenches. In other words, fill material 242 may be contained within one or more spaces 234, i.e. within one or more trenches. In other words, fill material 242 may be formed lower in the one or more trenches, than the surface of carrier back side 206, i.e. the surface of die back sides 206a, 206b. One or more spaces 234 and therefore the one or more etched trenches may form the dicing grooves separating the plurality of dies 216a, 216b.

Figure 2F:
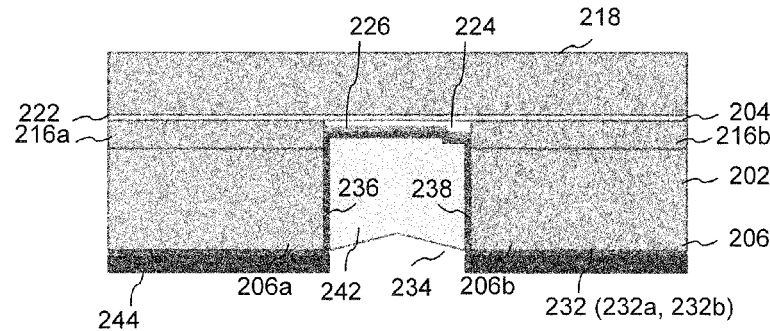

In FIG. 2F, at least one metallization layer 244, i.e. backside metallization layer, for packaging the dies 216a, 216b, may be subsequently formed over back side of the dies 206a, 206b. In other words, at least one metallization layer 244 for packaging the dies 216a, 216b, may subsequently be formed over back side of the dies 206a, 206b after selectively removing one or more portions from a carrier including a plurality of dies 216a, 216b, for separating the plurality of dies 216a, 216b along the selectively removed one or more portions 214, wherein the one or more portions 214 are located between dies 216a, 216b. Packaging dies 216a, 216b includes attaching at least one die 216a, 216b from plurality of dies 216a, 216b to a chip package via at least one metallization layer 244.

Forming at least one metallization layer 244 over a back side of plurality of dies 206a, 206b may include forming a backside metallization layer 244 over a back side of plurality of dies 206a, 206b. Forming at least one metallization layer 244 over a back side of plurality of dies 206a, 206b may include forming a eutectic adhesive between at least one die 216a, 216b from plurality of dies 216a, 216b and a chip package.

At least one metallization layer 244 may include a backside metallization layer, wherein back side metallization layer 244 may include an adhesive, e.g. a eutectic adhesive which may be used for attaching a die to a chip package, e.g. for attaching at least one die from the plurality of dies to a chip package. At least one metallization layer 244, i.e. backside metallization layer may include at least one from the following group of materials, the group consisting of: gold, gold-tin.

At least one metallization layer 244, e.g. backside backside metallization layer, may be formed by electrochemical deposition (ECD) or electroless deposition.

Forming one or more layers 232, over back side of plurality of dies 206a, 206b may include forming a seed layer 232b over back side of plurality of dies 206a, 206b for electrochemically depositing at least one metallization layer 244. At least one metallization layer 244, e.g. backside backside metallization layer, may be formed by electrochemical deposition (ECD) or electroless deposition, wherein seed layer 232b may be a seed metal layer for electrochemical deposition (ECD) or electroless deposition of one metallization layer 244. In other words, seed layer 232b and one metallization layer 244 may include the same material, e.g. Cu.

At least one metallization layer 244, e.g. backside backside metallization layer, may be formed by techniques such as sputtering, evaporation. Seed layer 232b may not be required in this case.

Forming one or more layers 232 over back side of plurality of dies 206a, 206b and depositing fill material 242 into one or more spaces 234 separating plurality of dies 216a, 216b, may be carried out before subsequently forming at least one metallization layer 244 over a back side of dies 206a, 206b.

Depositing a fill material 242 into one or more spaces 234 separating plurality of dies 216a, 216b may prevent at least one metallization layer 244 forming in one or more spaces 234 separating plurality of dies 216a, 216b. Fill material 242 may block the deposition of backside metallization layer 244 inside the dicing lines, e.g. on one or more sidewalls 236, 238.

Figure 2G:
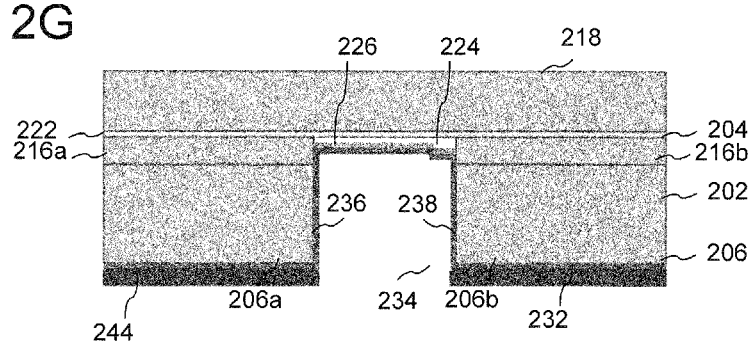

In FIG. 2G, fill material 242 may be removed from one or more spaces 234 separating plurality of dies 216a, 216b.

Figure 2H:
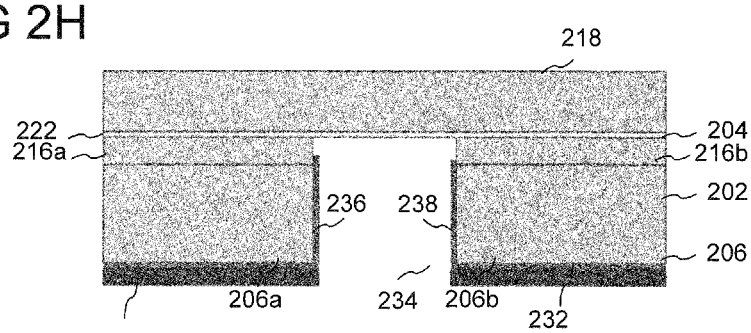

In FIG. 2H, stopping layer 226 may be removed from one or more spaces 234 separating plurality of dies 216a, 216b.

Figure 2I:
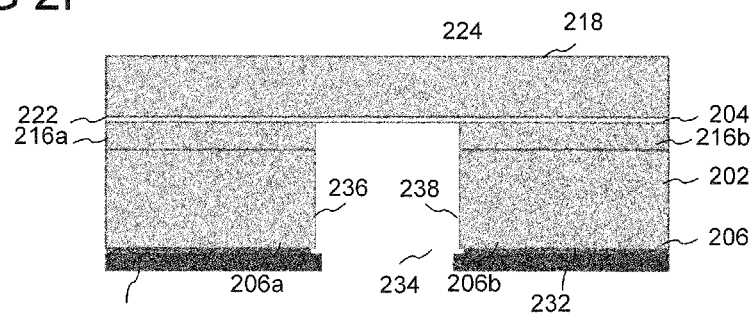

In FIG. 2I, one or more layers 232 may be removed from one or more spaces 234 separating plurality of dies 216a, 216b. One or more layers 232, e.g. barrier layer, e.g. seed layer, may be removed by an anisotropic etch if it is desired that one or more layers 232 remain over sidewall 236, 238. Sidewall 236, 238 of dies 216a, 216b may be an equipotential area. One or more layers 232, e.g. barrier layer, e.g. seed layer, may be removed by an isotropic etch if removal of one or more layers 232 formed over sidewall 236, 238 is desired.

Removal of fill material 242, and one or more layers 232, e.g. barrier layer, e.g. seed layer, and where necessary stopping layer 226, may be selective to backside metallization layer 244. In other words, backside metallization layer 244 may not be removed by an etch for removing fill material 242 and one or more layers 232, e.g. barrier layer, e.g. seed layer.

Separated plurality of dies 216a, 216b may be held by supporting material 218; and may be released from supporting material 218 after subsequently forming at least one metallization layer 244 for packaging dies over a back side of plurality of dies 216a, 216b.

Separated plurality of dies 216a, 216b may be held by supporting material 218; and may be released from supporting material 218 after removal of fill material 242. Separated plurality of dies 216a, 216b may be held by supporting material 218; and may be released from supporting material 218 after removal of fill material 242, one or more layers 232, e.g. barrier layer, e.g. seed layer, and where necessary stopping layer 226.

An individualized die, i.e. a separated die 216a, 216b, from separated plurality of dies 216a, 216b may subsequently be attached to a chip package. At least one metallization layer 244 may be used for attaching the individualized die i.e. the separated die 216a, 216b, to a chip package. At least one metallization layer 244 may be used to form a eutectic adhesive between the individualized die i.e. the separated die 216a, 216b, and the chip package. The chip package may include part of a bond wire. The chip package may include part of a chip-carrier for carrying dies.

Figure 3:
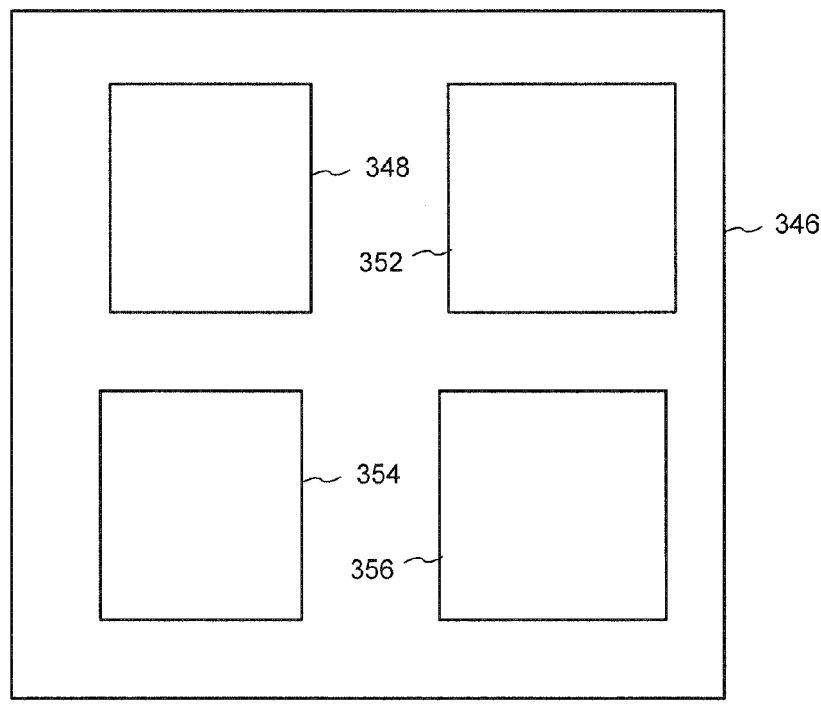
FIG. 3 shows a processing device for separating a plurality of dies according to an embodiment.

FIG. 3 shows a processing device 346 for separating a plurality of dies 216a, 216b according to the method described with respect to FIG. 1 and FIGS. 2A to 2I. Processing device 346 may include: a separating apparatus 348 configured to selectively remove one or more portions 214 from carrier 202 including a plurality of dies 216a, 216b, to separate plurality of dies 216a, 216b along selectively removed one or more portions 214, wherein one or more portions 214 are located between dies 216a, 216b according to the method described with respect to FIG. 1 and FIGS. 2A to 2I.; a deposition apparatus 352 configured to subsequently form over a back side of dies 206a, 206b, at least one metallization layer 244 for packaging dies 216a, 216b; a packaging apparatus 354 for packaging dies 216a, 216b according to the method described with respect to FIG. 1 and FIGS. 2A to 2I.; and an insertion apparatus 356 for inserting separated dies 216a, 216b into deposition apparatus 352 according to the method described with respect to FIG. 1 and FIGS. 2A to 2I.

Various embodiments provide a method for separating a plurality of dies. The method may include: selectively removing one or more portions from a carrier including a plurality of dies, for separating the plurality of dies along the selectively removed one or more portions, wherein the one or more portions are located between the dies; and subsequently forming over a back side of the dies, at least one metallization layer for packaging the dies.

According to an embodiment, the method may further include holding the separated plurality of dies by a supporting material; and releasing the plurality of dies from the supporting material after subsequently forming the at least one metallization layer for packaging the dies over a back side of the dies.

According to an embodiment, the method may further include holding the carrier including the plurality of dies by a supporting material, wherein the carrier is held by the supporting material from a carrier front side; and wherein selectively removing one or more portions from a carrier includes selectively removing the one or more portions from a carrier back side.

According to an embodiment, selectively removing one or more portions from a carrier includes forming a masking layer over a carrier back side, wherein the masking layer allows the one or more portions to be selectively removed and shields the dies from being removed.

According to an embodiment, selectively removing one or more portions from a carrier includes selectively removing the one or more portions from a carrier back side until a stopping layer formed on a carrier front side is exposed from the carrier back side.

According to an embodiment, selectively removing one or more portions from the carrier includes selectively removing the one or more portions by chemical etching.

According to an embodiment, the method may further include selectively removing one or more portions from the carrier includes selectively removing the one or more portions by plasma etching.

According to an embodiment, the method may further include depositing a fill material into the one or more spaces separating the plurality of dies, before subsequently forming the at least one metallization layer.

According to an embodiment, the method may further include forming one or more layers over the back side of the plurality of dies for forming the at least one metallization layer.

According to an embodiment, the method may further include forming one or more layers over the back side of the plurality of dies and depositing a fill material into the one or more spaces separating the plurality of dies, wherein forming the one or more layers and depositing the fill material is carried out before subsequently forming the at least one metallization layer for packaging the dies over a back side of the dies.

According to an embodiment, depositing a fill material into the one or more spaces separating the plurality of dies prevents the at least one metallization layer forming in the one or more spaces separating the plurality of dies.

According to an embodiment, forming one or more layers over the back side of the plurality of dies includes forming a seed layer over the back side of the plurality of dies for electrochemically depositing the at least one metallization layer.

According to an embodiment, forming one or more layers over the back side of the plurality of dies includes forming a bather layer over the back side of the plurality of dies.

According to an embodiment, forming one or more layers over the back side of the plurality of dies includes forming one or more layers in the one or more spaces separating the plurality of dies.

According to an embodiment, subsequently forming at least one metallization layer over a back side of the plurality of dies includes subsequently forming a backside metallization layer over a back side of the plurality of dies.

According to an embodiment, the method may further include subsequently forming at least one metallization layer over a back side of the plurality of dies includes subsequently forming at least one metallization layer for forming a eutectic adhesive between at least one die from the plurality of dies and a chip package.

According to an embodiment, packaging the dies includes attaching at least one die from the plurality of dies to a chip package via the at least one metallization layer.

According to an embodiment, the chip package includes a bond wire.

According to an embodiment, the chip package includes a chip-carrier for carrying dies.

According to an embodiment, the method may further include removing the fill material from the one or more spaces separating the plurality of die.

According to an embodiment, the method may further include removing the one or more layers from the one or more spaces separating the plurality of dies.

A processing device for separating a plurality of dies is provided, the processing device including: a separating apparatus configured to selectively remove one or more portions from a carrier including a plurality of dies, to separate the plurality of dies along the selectively removed one or more portions, wherein the one or more portions are located between the dies; a deposition apparatus configured to subsequently form over a back side of the dies, at least one metallization layer for packaging the dies; a packaging apparatus for packaging the dies; and an insertion apparatus for inserting the separated dies into the deposition apparatus.

Various embodiments provide a method and a processing device for separating a plurality of dies from a carrier, e.g. by plasma dicing, providing a backside metallization layer, while preventing the deposition of backside metal into dicing grooves.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for separating a plurality of dies, the method comprising:
    selectively removing one or more portions from a carrier comprising the plurality of dies, for separating the plurality of dies along the selectively removed one or more portions, wherein the one or more portions are located between the dies; wherein selectively removing one or more portions creates one or more spaces separating the plurality of dies;
    depositing a fill material into the one or more spaces separating the plurality of dies;
    subsequently forming over a back side of the dies, at least one metallization layer for packaging the dies; and
    removing substantially all of the fill material from the one or more spaces separating the plurality of dies before the plurality of dies are separated.

2. The method according to claim 1, comprising:
    holding the separated plurality of dies by a supporting material; and
    releasing the plurality of dies from the supporting material after subsequently forming the at least one metallization layer for packaging the dies over a back side of the dies.

3. The method according to claim 1, further comprising:
    holding the carrier comprising the plurality of dies by a supporting material, wherein the carrier is held by the supporting material from a carrier front side; and
    wherein selectively removing one or more portions from a carrier comprises selectively removing the one or more portions from a carrier back side.

4. The method according to claim 1, wherein selectively removing one or more portions from a carrier comprises forming a masking layer over a carrier back side, wherein the masking layer allows the one or more portions to be selectively removed and shields the dies from being removed.

5. The method according to claim 1, wherein selectively removing one or more portions from the carrier comprises selectively removing the one or more portions from a carrier back side until a stopping layer formed on a carrier front side is exposed from the carrier back side.

6. The method according to claim 1, wherein selectively removing one or more portions from the carrier comprises selectively removing the one or more portions by chemical etching.

7. The method according to claim 1, wherein selectively removing one or more portions from the carrier comprises selectively removing the one or more portions by plasma etching.

8. The method according to claim 1, further comprising
    forming one or more layers over the back side of the plurality of dies for forming the at least one metallization layer.

9. The method according to claim 1, wherein
    depositing the fill material into the one or more spaces separating the plurality of dies prevents the at least one metallization layer forming in the one or more spaces separating the plurality of dies.

10. The method according to claim 8, wherein
    forming one or more layers over the back side of the plurality of dies comprises forming a seed layer over the back side of the plurality of dies for electrochemically depositing the at least one metallization layer.

11. The method according to claim 8, wherein
    forming one or more layers over the back side of the plurality of dies comprises forming a bather layer over the back side of the plurality of dies.

12. The method according to claims 8, wherein
    forming one or more layers over the back side of the plurality of dies comprises forming one or more layers in the one or more spaces separating the plurality of dies.

13. The method according to claim 1, wherein subsequently forming at least one metallization layer over a back side of the plurality of dies comprises subsequently forming a backside metallization layer over a back side of the plurality of dies.

14. The method according to claim 1, wherein subsequently forming at least one metallization layer over a back side of the plurality of dies comprises subsequently forming at least one metallization layer for forming a eutectic adhesive between at least one die from the plurality of dies and a chip package.

15. The method according to claim 1, wherein packaging the dies comprises attaching at least one die from the plurality of dies to a chip package via the at least one metallization layer.

16. The method according to claim 15 wherein the chip package comprises a bond wire.

17. The method according to claim 15 wherein the chip package comprises a chip-carrier for carrying dies.

18. The method according to claim 13, further comprising
    removing the one or more layers from the one or more spaces separating the plurality of dies.

19. A method for separating a plurality of dies, the method comprising:
    selectively removing one or more portions from a carrier comprising the plurality of dies for separating the plurality of dies along the selectively removed one or more portions, wherein the one or more portions are located between the dies; wherein selectively removing one or more portions creates one or more spaces separating the plurality of dies;
    forming one or more layers over the back side of the plurality of dies and depositing a fill material into the one or more spaces separating the plurality of dies,
    subsequently forming over a back side of the dies, at least one metallization layer for packaging the dies; and
    removing substantially all of the fill material from the one or more spaces separating the plurality of dies before the plurality of dies are separated.

* * * * *

UNITED STATES PATENT AND TRADEMARK OFFICE
CERTIFICATE OF CORRECTION

| | | |
|---|---|---|
| PATENT NO. | : 9,165,895 B2 | Page 1 of 1 |
| APPLICATION NO. | : 13/290201 | |
| DATED | : October 20, 2015 | |
| INVENTOR(S) | : Helmut Brunner et al. | |

It is certified that error appears in the above-identified patent and that said Letters Patent is hereby corrected as shown below:

In the Claims

Claim 11 - Column 10, line 20: delete "forming a bather layer over the back side" and insert --forming a barrier layer over the back side-- in place thereof.

Signed and Sealed this
Seventh Day of June, 2016

Michelle K. Lee
*Director of the United States Patent and Trademark Office*